United States Patent [19]

Easter et al.

[11] Patent Number: 4,870,029
[45] Date of Patent: Sep. 26, 1989

[54] METHOD OF FORMING COMPLEMENTARY DEVICE STRUCTURES IN PARTIALLY PROCESSED DIELECTRICALLY ISOLATED WAFERS

[75] Inventors: William G. Easter, Reading; Daniel D. Leffel, Earl Township, Berks County, both of Pa.

[73] Assignee: American Telephone and Telegraph Company, AT&T-Technologies, Inc., Berkeley Heights, N.J.

[21] Appl. No.: 107,081

[22] Filed: Oct. 9, 1987

[51] Int. Cl.$^4$ .................. H01L 21/308; H01L 21/20
[52] U.S. Cl. ........................................ 437/78; 437/90; 437/62; 437/67; 148/DIG. 50
[58] Field of Search ................. 437/78, 79, 56, 57, 437/58, 59, 60, 61, 62, 65, 67, 38, 89, 90; 357/55; 156/648, 649; 148/DIG. 50

[56] References Cited

U.S. PATENT DOCUMENTS

| | | | |
|---|---|---|---|
| 3,865,649 | 2/1975 | Beasom | 437/56 |
| 4,017,341 | 4/1977 | Suzuki et al. | 437/40 |
| 4,141,765 | 2/1979 | Druminski et al. | 437/93 |
| 4,333,227 | 6/1982 | Horng et al. | 437/33 |
| 4,378,630 | 4/1983 | Horng et al. | 437/33 |
| 4,416,050 | 11/1983 | Sarace | 29/571 |
| 4,553,318 | 11/1985 | Chandrasekhar | 437/67 |
| 4,554,059 | 11/1985 | Short et al. | 204/129.3 |
| 4,577,395 | 3/1986 | Saibata | 437/67 |
| 4,579,625 | 4/1986 | Tabata et al. | 156/643 |
| 4,582,565 | 4/1986 | Kawakatsu | 437/62 |
| 4,593,458 | 6/1986 | Adler | 29/576 |
| 4,624,047 | 11/1986 | Tani | 29/57 |
| 4,713,678 | 12/1987 | Womack et al. | 357/55 |
| 4,733,287 | 3/1988 | Bower | 357/55 |

FOREIGN PATENT DOCUMENTS 0187263 8/1986 Japan ..................... 437/38

OTHER PUBLICATIONS

Ghandhi, VLSI Fabrication Principle, John Wiley & Son, 1983, pp. 243-243.
Chi et al., "Conversion of the Conductivity Mode in Silicon by Oxygen Ion Implantation and Its Application in a Novel Dielectric Isolation Technique", *Appl. Phys. Lett.* 40(5), Mar. 1, 1982, pp. 420-422.

Primary Examiner—Brian E. Hearn
Assistant Examiner—T. N. Quach
Attorney, Agent, or Firm—Wendy W. Koba

[57] ABSTRACT

A method has been developed for altering the resistivity of selected regions (tubs) in a dielectrically isolated (DI) wafer. Subsequent to the formation of the conventional tub structure, the wafer is patterned and etched to expose selected tubs. These tubs are then etched and selectively implanted and an epitaxial layer of a new resistivity value is grown in the empty tube regions. The resistivity of the epitaxial material may be chosen to alter the conductivity of the selected tub regions.

3 Claims, 2 Drawing Sheets

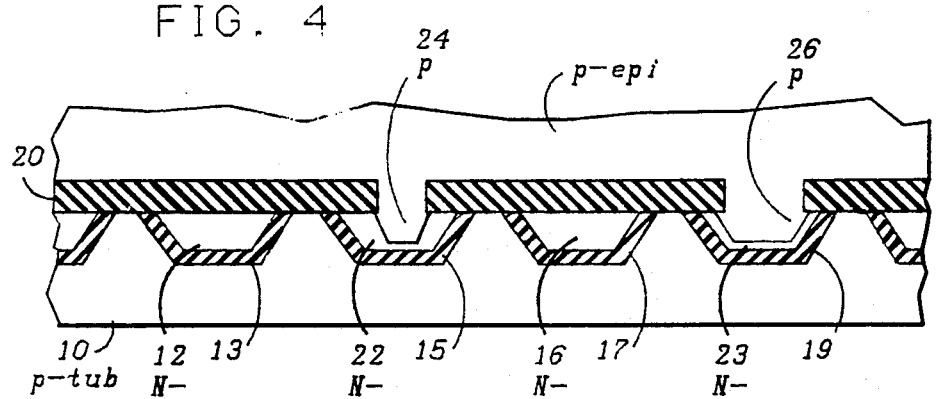
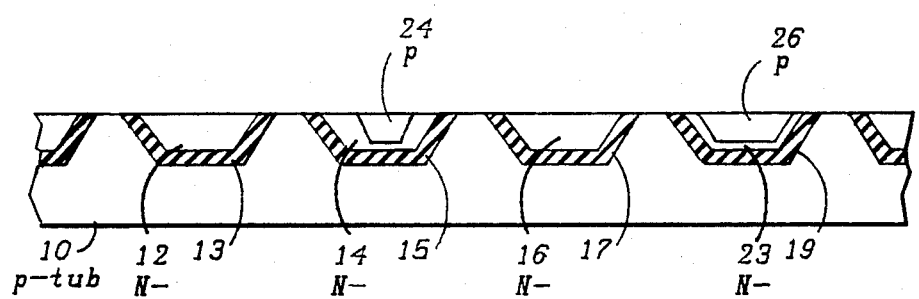
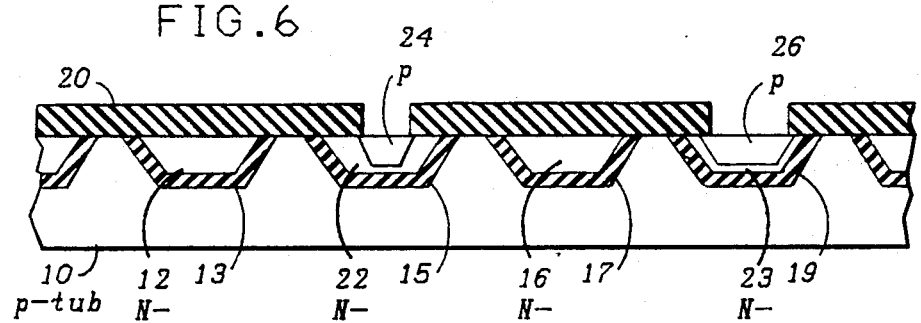

METHOD OF FORMING COMPLEMENTARY DEVICE STRUCTURES IN PARTIALLY PROCESSED DIELECTRICALLY ISOLATED WAFERS

BACKGROUND OF THE INVENTION

1. Field of the Invention

The present invention relates to a method of forming complementary device structures in partially processed dielectrically isolated (DI) wafers and, more particularly, an etch and regrow method capable of forming such complementary device structures.

2. Description of the Prior Art

For high voltage integrated device structures, some type of isolation between certain active regions is required to prevent premature breakdown of the device. Junction isolation, formed by including additional pn junctions in the device structure, may be used for this purpose. However, these pn junctions have a voltage limit themselves, and add to the overall area occupied by the structure. As an alternative, dielectric isolation (DI) is used to surround the complete device with a layer of dielectric material. Many references exist in the prior art which describe this type of structure.

In many sophisticated circuit applications, it is required to provide both n-type and p-type devices on the same substrate (complementary structures). It is also useful in many applications to form separate regions with differing resistivities. Accomplishing these types of structures using dielectric isolation has been a formidable problem in the past. One solution is disclosed in U.S. Pat. No. 4,579,625 issued to A. Tabata et al. on Apr. 1, 1986. The method taught by Tabata et al. includes forming a plurality of projecting p-type polysilicon regions above a substrate surface, removing selected projections which are to be areas of n-type conductivity, and growing an n-type epitaxial layer over the entire surface of the device. The structure is then anisotropically etched to form n-type projections. The Tabata et al. process requires at least five photoresist operations, four silicon etches, and various other etching operations to form the complete structure.

An alternative fabrication technique is disclosed in U.S. Pat. No. 4,593,458 issued to M. S. Adler on June 10, 1986. Adler forms DI regions (tubs) of lightly-doped n-type conductivity and then selectively ion implants the various tubs to form either n-tubs or p-tubs. However, ion implantation as a doping method necessarily limits the type of final device formed to lateral devices only, since the diffusion gradient of the ion implanted species drops off at a rate such that the bottom area of the tub is rather lightly doped. Additionally, Adler discusses the formation of the epitaxial tube material directly on the conventional DI tub boundary of silicon dioxide. The process of forming an epitaxial region on top of a layer of silicon dioxide is not well understood, and is, at best, difficult to achieve.

U.S. Pat. No. 4,624,047 issued to S. Tani on Nov. 25, 1986 discloses yet another alternative method of forming complementary DI tubs. Tani replaces the projection-forming method of Tabata et al. with a method of forming p-type regions directly in an n-type substrate, through ion implantation, then proceeding with conventional DI processing to form the n-type and p-type tubs. As with the Adler structure, however, the use of ion implantation to form the p-type regions limits the downward diffusion of the dopant, restricting the final device structure to a lateral form.

Therefore, a need remains for a complementary DI structure which is relatively easy to fabricate and allows the formation of vertical, as well as lateral, device structures.

SUMMARY OF THE INVENTION

The problem remaining in the prior art is addressed by the present invention which relates to a new technique for forming DI devices of complementary conductivity type and, more particularly, to a technique for altering the resistivity of selected regions of the DI wafer at the completion of the conventional tub fabrication process so as to form the complementary structure.

In accordance with the present invention, a partially processed DI wafer (prior to the diffusion of the active device regions) is masked to expose designated areas (tubs) which are to be changed in resistivity value. For example, designated n-tubs may be changed to n+ tubs, n- tubs, or p tubs. The tub material in these exposed regions is then removed and an epitaxial growth process is utilized to fill the empty tubs with epitaxial material of the new resistivity value.

In a preferred embodiment of the invention, a selective epitaxial growth process is used which restricts the epitaxial growth to only the desired tub locations.

It is an aspect of the present invention to allow for greater flexibility in the design of complementary DI devices, since the resistivity alteration is performed near the end of the fabrication process.

Other and further aspects of the present invention will become apparent during the course of the following discussion and by reference to the accompanying drawings.

BRIEF DESCRIPTION OF THE DRAWING

Referring now to the drawings,

FIGS. 1–5 illustrate a first fabrication process for altering the resistivity of various tubs in a partially processed DI wafer in accordance with the teachings of the present invention; and FIG. 6 illustrates a step in the alternative selective epitaxial growth fabrication process for altering the resistivity of various tubs in a partially processed DI wafer in accordance with the teachings of the present invention.

DETAILED DESCRIPTION

Figure 1:
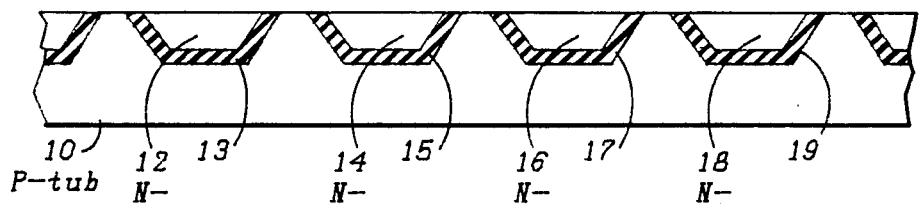

Referring now to the drawings, FIG. 1 illustrates, in a cross-sectional view, a conventional dielectrically isolated (DI) wafer at the completion of the tub fabrication process. Various techniques, well-known in the art, may be used to form this structure. The exemplary arrangement of FIG. 1 comprises a silicon substrate 10 including a plurality of n-type tub regions 12, 14, 16 and 18. In accordance with the dielectric isolation technique, each tub is separately isolated by a dielectric layer which wraps around the bottom and sides of the tub, dielectric layer 13 being associated with tub 12, dielectric layer 15 with tub 14, layer 17 with tub 16, and layer 19 with tub 18. To continue with the conventional fabrication process, various regions would be diffused into n-tubs 12, 14, 16 and 18 to form the required high voltage devices. In accordance with the present invention, however, various ones of these tubs will be converted to p-type, or a different n-type resistivity, prior to the device formation so as to allow the formation of complementary DI structures.

Figure 2:
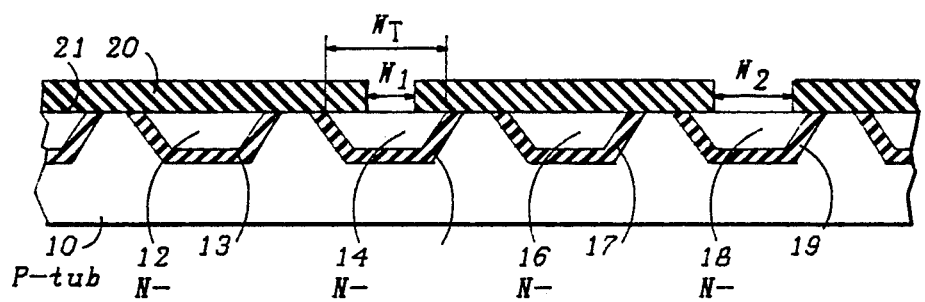

The first step in the process of the present invention is illustrated in FIG. 2. An oxide layer 20 is grown to completely cover top surface 21 of substrate 10. Oxide layer 20 is then patterned and etched to expose those tubs which are to be altered to, for example, p-type. It is to be understood that the selected tubs may instead be altered in n-type resistivity (forming regions of n+ or n- resistivity, for example). For the exemplary embodiment under discussion, tubs 14 and 18 are exposed so that they may be converted to p-type tubs. The width of the windows opened above the tubs is a variable which is controlled to provide various device structures, as described in detail below. For example, the window opened above tub 14 comprises a width $W_1$ which is somewhat less than the full width $W_T$ of tub 14. In contrast, the window opened above tub 18 comprises a width $W_2$ which is somewhat greater than $W_1$.

Figure 3:
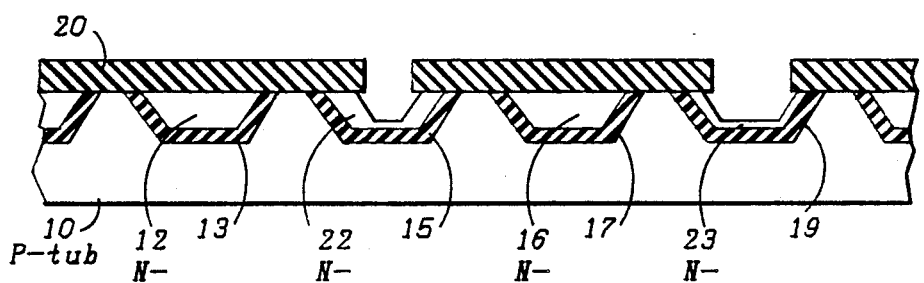

Once the appropriate tubs have been exposed, an appropriate etch (utilizing KOH, for example) is used to remove the tub material from the exposed regions. The resultant structure is shown in FIG. 3. A portion 22 of the n-type material in tub 14 will remain at the completion of this process, since this area was protected by the relatively small width $W_1$ in mask layer 20 during the etch. A similar region 23 will remain in tub 18. Regions 22 and 23 may then be ion implanted with either an n-type species or p-type species to form wrap-around layers, which may be advantageous for certain device applications.

Subsequent to the anisotropic etch, an epitaxial material of p-type material is grown to completely cover the top surface of the wafer, where a chemical vapor deposition (CVD) process may be used to grow this epitaxial material. This particular step in the fabrication process is illustrated in FIG. 4. This process results in the formation of p-type (monocrystalline) epitaxial regions 24 and 26 in tubs 14 and 18, respectively. As is well known in the art, the material grown over oxide 20 will comprise a polycrystalline structure. The final step in the process, illustrated in FIG. 5, is simply a polishing step, used to remove the epitaxial material, as well as oxide mask layer 20, from the areas outside of the selected tub regions. Following this process, the conventional DI fabrication process is resumed, allowing the formation of active devices in both p-type tubs (24,26) and n-type tubs (12,16).

As an alternative technique, selective epitaxial process may be employed. In a selective epitaxial process, as is well-known in the art, various deposition parameters (temperature, pressure, constituent of deposition gases, etc.) are controlled so that the epitaxial material will grow only over exposed silicon, not silicon dioxide. Therefore, with reference to FIG. 3, selective epitaxial regions 24 and 26 will grow only in exposed tubs 14 and 18, the growth process stopping when the interface of dielectric layer 20 is reached. FIG. 6 illustrates a device structure formed using a selective epitaxial growth process. This alternative process avoids the need for a polishing step at the end of the fabrication process.

An advantage of the inventive process of forming a complementary DI structure is the simplicity of altering the locations of the p-type tubs and n-type tubs. The only required process change is to alter the mask used to expose the selected tubs. Therefore, all devices, regardless of final structure, may be similarly processed up to the fabrication step shown in FIG. 1. A variety of devices may then be formed from this generic substrate merely by utilizing different masks to open the selected tubs on each wafer. Subsequent to this masking step, the same processes (etch, n-type epitaxial growth) are used to form the new tubs, regardless of their location on each wafer.

What is claimed is:

1. A method of forming semiconductor wafer structures including dielectrically isolated tub regions of differing resistivities, the method comprising the steps of:

(a) providing a plurality of silicon tubs, exhibiting a first resistivity value, in a semiconductor substrate, each tub including a layer of dielectric material covering the side and bottom surfaces thereof;

(b) forming a patterning layer over the top major surface of said substrate;

(c) opening windows of predetermined widths in said patterning layer over tubs selected to be of a second, different, resistivity value, with selected windows being formed to comprise a width w less than the width of the associated tub region;

(d) removing the silicon material from the exposed tubs as determined by the predetermined window widths, wherein the selected windows with width w allowing a portion of the silicon tub material to remain in the exposed tubs at the end of the removal step;

(e) ion implanting the remaining silicon tub material portions in said selected tubs of step d), said implantation of a predetermined resistivity value so as to form a wrap-around layer over the dielectric isolation layer; and (f) growing an epitaxial silicon layer exhibiting the second resistivity value in the areas exposed in step (d).

2. The method of claim 1, wherein the remaining portion of the silicon tub material is ion implanted with a dopant of a first conductivity type.

3. The method of claim 1, wherein the remaining portion of the silicon tub material is ion implanted with a dopant of a second, opposite conductivity type.

* * * * *